(12) United States Patent
Coakley et al.

(10) Patent No.: US 9,110,148 B1
(45) Date of Patent: Aug. 18, 2015

(54) METHOD AND APPARATUS FOR DETECTION OF MULTIPLE PULSES IN A RADIO FREQUENCY SPECTRUM

(71) Applicant: Lockheed Martin Corporation, Bethesda, MD (US)

(72) Inventors: Breyt L. Coakley, Oneida, NY (US); Chris S. Foster, North Syracuse, NY (US); Bryan L. Cleaveland, Baldwinsville, NY (US); Joseph A. Ottaviano, Chitenango, NY (US); James P. Snyder, Liverpool, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 330 days.

(21) Appl. No.: 13/827,802

(22) Filed: Mar. 14, 2013

(51) Int. Cl.
*G01S 7/40* (2006.01)
*G01S 7/02* (2006.01)

(52) U.S. Cl.
CPC ..................... *G01S 7/021* (2013.01)

(58) Field of Classification Search
CPC ........................................ G01S 7/021
USPC ................. 342/13, 20, 194–195; 375/316
See application file for complete search history.

(56) References Cited

U.S. PATENT DOCUMENTS

| | | | | |
|---|---|---|---|---|
| 5,451,956 A * | 9/1995 | Lochhead | ........................ | 342/13 |
| 5,550,546 A * | 8/1996 | Noneman et al. | ................ | 342/13 |
| 6,043,771 A | 3/2000 | Clark et al. | | |
| 6,313,781 B1 * | 11/2001 | Lee | .................................. | 342/13 |
| 6,876,321 B1 * | 4/2005 | Slutzky et al. | ................... | 342/13 |
| 7,109,909 B2 * | 9/2006 | Gounalis | .......................... | 342/13 |

* cited by examiner

*Primary Examiner* — John B Sotomayor
(74) *Attorney, Agent, or Firm* — Howard IP Law Group, PC

(57) ABSTRACT

A method and apparatus for detection of multiple pulses present in a radio frequency (RF) environment comprises receiving the RF signal, sampling the RF signal and converting the samples from analog to digital. In-phase and quadrature components of the samples are converted to magnitude and phase. Magnitude and phase information is processed in parallel paths, each path tuned to detect pulses of a specific pulse width of interest. Filtered magnitude and phase data is processed to detect pulses. Multiple detected pulses from different processing paths are analyzed to characterize each detected pulse as to its originating source. Pulse width and time of incidence are compared to determine if multiple detected pulses represent a single pulse or unique and separate pulses. Pulse descriptor words are generated for each uniquely identified pulse.

20 Claims, 5 Drawing Sheets

METHOD AND APPARATUS FOR DETECTION OF MULTIPLE PULSES IN A RADIO FREQUENCY SPECTRUM

FIELD OF THE INVENTION

The present invention relates to radio signal processing. More particularly, the present invention relates to detecting multiple pulse signals in a radio frequency spectrum.

BACKGROUND OF THE INVENTION

The electromagnetic spectrum is used for a variety of purposes. Communications rely heavily on the electromagnetic spectrum. Other related systems such as radar, use the electromagnetic spectrum to identify objects that are in the area surrounding a receiver. As technology increases, the number of devices emitting electromagnetic energy into the environment is increasing dramatically.

Military operations are executed in an information environment increasingly complicated by the electromagnetic spectrum. Therefore, there is a need for military forces to have unimpeded access to the electromagnetic environment. The use of the electromagnetic environment creates vulnerabilities and opportunities for electronic warfare (EW) in support of military operations.

EW includes three major subdivisions: electronic attack (EA), electronic protection (EP), and electronic warfare support (ES). EA involves the use of electromagnetic energy, directed energy or anti-radiation weapons to attack personnel, facilities, or equipment with the intent of degrading, neutralizing, or destroying enemy combat capability. EP involves actions taken to protect personnel, facilities and equipment from any effects of friendly or enemy use of the electromagnetic spectrum that degrade, neutralize, or destroy friendly combat capability. ES is the subdivision of EW involving actions tasked by, or under direct control of, an operational commander to search for, intercept, identify and locate or localize sources of intentional and unintentional radiated electromagnetic energy for the purpose of immediate threat recognition, targeting, planning and conduct of future operations.

As the electromagnetic environment becomes more congested, the signals detectable in the electromagnetic environment become more difficult to detect and identify. For example, unintended electromagnetic energy radiated from a vehicle or weapon, for example a missile, may be in the form of pulse energy. As the electromagnetic environment becomes more crowded, the number and duration of electromagnetic pulses across a wide radio frequency bandwidth increases. In addition to electromagnetic radiation from potential targets, other random radiated electromagnetic energy may be present that does not represent a threat. It is therefore important to monitor the electromagnetic environment and identify the source of detected electromagnetic energy. Conventional detection systems may detect only a very small number of pulse widths and frequencies. Alternative systems and methods for detecting electromagnetic pulses with multiple pulse widths in the electromagnetic environment are desired.

SUMMARY OF THE INVENTION

An apparatus for detection of multiple pulses in a radio frequency (RF) environment comprises a receiver configured to receive an RF signal. An analog to digital converter samples the analog RF signal and provides time samples in digital form. A FIR filter may be used to eliminate unnecessary noise. A coordinate translator converts the received samples from in-phase and quadrature components to magnitude and phase components in the polar domain. The magnitude and phase data for all pulses received in the RF signal are processed via parallel processing paths, each being tuned to pass a desired pulse width or video bandwidth of interest. Within each parallel processing path, phase information is used to derive frequency information about a received signal, while magnitude information is used to filter a desired pulse width using magnitude low pass filters. The filtered magnitude and phase information is passed to a complex parameter measurement unit which detects pulses based on magnitude information with respect to a predetermined threshold. If a pulse is detected, phase difference information for the signal containing the detected pulse may be used to derive a carrier frequency of the detected pulse. In the case where multiple pulse detections take place, a pulse descriptor word resolver module analyzes the pulse detections to characterize each detected pulse as to its origin. Pulse width and time of incidence may be used to classify multiple detected pulses as originating from a common source, thereby representing the same pulse. A pulse descriptor word representative of the identified pulse may be generated based on selecting the detected pulse with the longest pulse width from the multiple detected pulses. Alternatively, the detected pulses may be classified as unique pulses originating from separate sources. Pulse descriptor words are generated for each uniquely identified pulse.

BRIEF DESCRIPTION OF THE DRAWINGS

The detailed description of the preferred embodiments of the present invention may be more readily understood with reference to the accompanying drawings in which like numbers represent like parts and in which.

DETAILED DESCRIPTION

Figure 1:
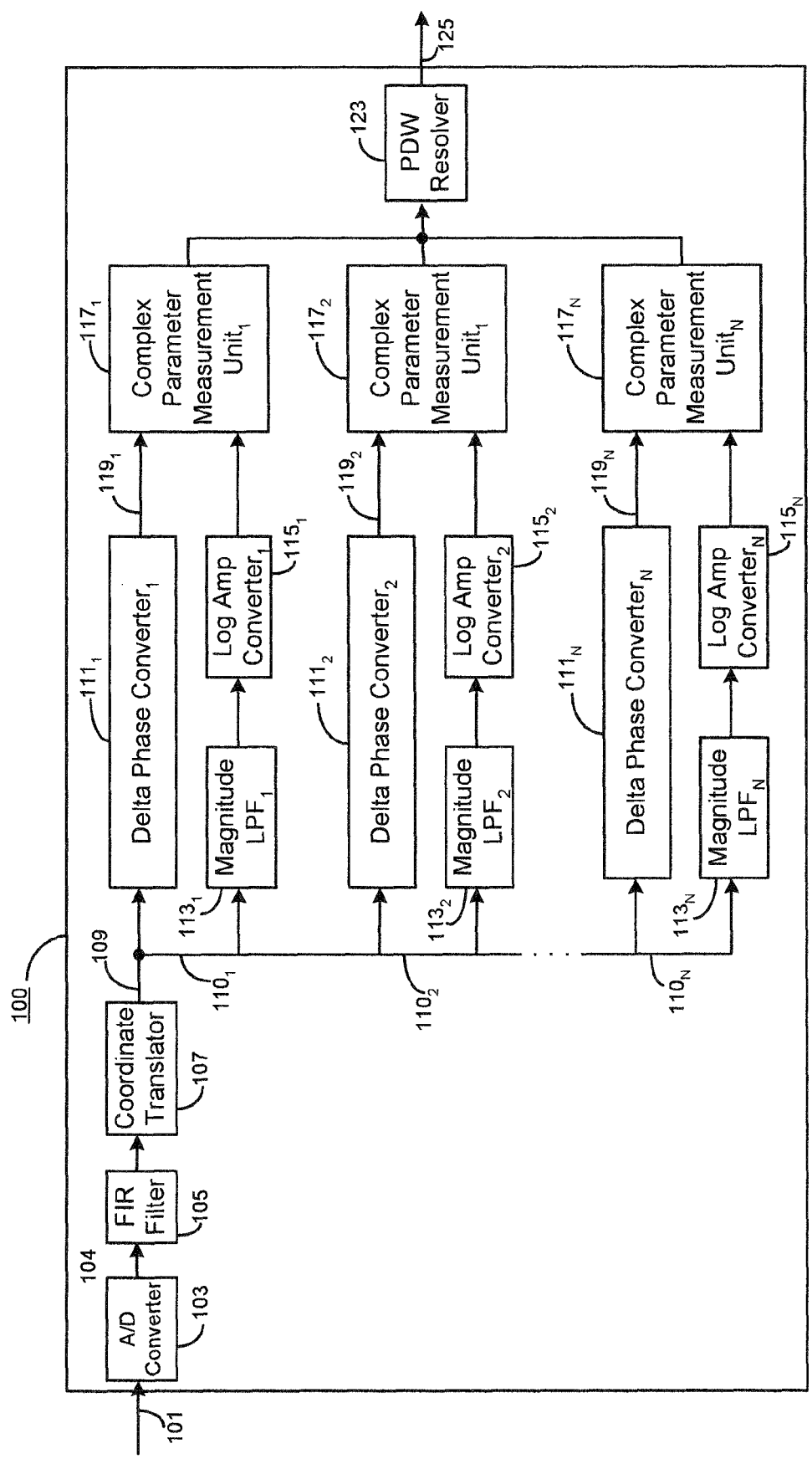
FIG. 1 is a block diagram of an apparatus to detect multiple pulses in a received radio frequency signal according to an embodiment of the present invention.

FIG. 1 is a block diagram illustrating a multi pulse detector according to an embodiment of the present invention. Multiple pulses comprising different pulse widths are received in a radio frequency (RF) signal 101. Multi pulse detector 100 attempts to identify the signals contained in the RF signal 101, such as multiple pulses having varying pulse widths. Multi pulse receiver 100 may encounter a extremely wide range of pulse widths in the RF environment. The video bandwidth associated with a given pulse width is a matched filter. Therefore, using a single static video bandwidth in an environment containing varying pulse widths creates a situation where if the video bandwidth is too narrow, short pulses will not be detected. Conversely, using a video bandwidth that is too wide decreases sensitivity to the desired signal and allows noise to pass through. The multi pulse detector 100 shown in FIG. 1 overcomes the above problems by providing detection across multiple video bandwidths in a single detector 100.

As shown in FIG. 1, the received RF signal 101 is sampled by an analog to digital converter 103. The analog to digital converter 103 takes periodic samples of the received RF signal 101 and converts the measured samples into a digital representation 104 of the RF signal 101. Once converted to a digital representation 104, the information carried in the RF signal 101 may be processed efficiently using digital processing equipment (not shown).

The digital representation 104 of the RF signal 101 is then passed through finite impulse response (FIR) filter 105. FIR filter 105 removes unnecessary noise from the discrete digital representation signal 104 to enable the detector 100 to more easily identify a desired target component of RF signal 101. The filtered digital signal is then sent to a coordinate translator 107.

Coordinate translator 107 receives the signal based on its in-phase (I) and quadrature (Q) components and translates the signal into its polar coordinates of magnitude and phase. As will be described in more detail below, magnitude is important in detecting multiple pulses, while the phase may be used as a proxy for frequency and used to verify the carrier frequencies of a potential detected pulse. Pulse descriptor words (PDWs) are defined in terms of amplitude and phase, and therefore coordinate translator 107 prepares the received signal 101 by converting the digital representation 104 to a form from which PDWs may be generated.

By way of example, compared to the field of electronic warfare (EW) where surveillance is performed on airborne signals, and where the receiver does not know what was transmitted, traditional technologies such as radar have an advantage. Because radar transmits a known signal and measures changes in the reflected signal returned to the receiver, radar is well suited for processing received signals directly from their I and Q components. However, in EW, because essentially nothing is known about the signal being received, it is prohibitive to attempt finding target signals using in-phase and quadrature data. Alternatively, a simpler approach is used converting the I and Q data from rectangular coordinate data into a polar representation in terms of magnitude and phase. For example, an operator looking at an oscilloscope representative of a received signal may view the signal as exhibiting a very steep rise (in magnitude) and then fall back down rapidly, thereby indicating a pulse. As discussed, radar does not operate in the same way, as radar algorithms operate directly on in-phase and quadrature data. EW on the other hand, finds targets using the magnitude domain instead of the I and Q domain.

The translated signal 109 contains all the pulses carried on RF signal 101, and is presented to a number of parallel paths 110₁-110ₙ. Each parallel path 110 may be tuned to filter and identify a pulse of a specific pulse width of interest. Based on the RF environment being monitored for pulse detection, multiple paths 110 are established to detect all pulse widths of which there is an interest. For example, in a exemplary RF environment, it may be determined that pulses having pulse widths of 1 microsecond (μs), 10 μs, 100 μs, 1 millisecond (ms), 10 ms, 100 ms and 1 second may be of interest for monitoring. By way of example, for each factor of 10 with regard to pulse widths to be monitored, a new parallel path 110 may be configured to detect pulses having a given pulse width. For example, for the pulse widths described above, an individual processing path 110 would be defined for each of the pulse widths thus resulting in seven parallel paths 110₁-110₇. Each parallel path 100 may be tuned to most effectively detect pulses at the tuned pulse width. Some spillover of pulse energy into adjacent processing paths may result in potential multiple detections of a pulse by multiple processing paths 110. Such conflicts are resolved by complex parameter measurement units (CPMUs) 117₁-117ₙ in a manner described below.

The translated signal 109 is presented to each parallel processing path 110 containing all detectable pulses. Each processing path 110 will filter the pulse widths to which the path 110 is tuned. Within each processing path 110 there are two additional parallel paths a first feeding into a delta phase converter 111₁-111ₙ, and the second feeding into a magnitude low pass filter (LPF) 113₁-113ₙ. Delta phase converter 111 provides a coarse frequency measurement based on a detected difference in phase of the received translated signal 109. A phase change in the translated signal 109 corresponds to a carrier frequency. During conflict resolution, as will be described below, the carrier frequency may be used to confirm multiple pulse detections as originating from the same source, or conversely, different carrier frequencies may indicate multiple pulse sources. Delta phase converter 111 is configured to work in tandem with its associated magnitude LPF 113. For example, referring to FIG. 1, if magnitude LPF 113₁ was tuned to detect a 1 μs pulse width, then delta phase converter 111₁ is configured to process a range of phases or frequencies relevant to the pulse width of 1 μs.

Magnitude LPFs 113₁-113ₙ receive the translated signal 109 and treats the carrier as having a constant amplitude. The emitter pulse amplitude is effectively translated to the bottom of the channel bandwidth. Thus, the magnitude LPF 113 may be configured to eliminate unnecessary noise by decreasing the effective noise bandwidth of the system. It should be noted, however that the magnitude LPF 113 cutoff should be high enough to pass the smallest pulse width measurement requirement.

In the example of FIG. 1, each magnitude LPF 113₁-113ₙ may be configured to detect a increasing pulse width. Based on the example pulse widths described above, magnitude LPF 113₁ may be tuned to detect a 1 μs pulse width, magnitude LPF 113₂ may be tuned to detect a 10 μs pulse width and so on, such that magnitude LPF 113ₙ may be tuned to detect a 1 second pulse width. By way of example, assuming an RF environment in which a 1 μs pulse with a frequency ranging from 0-2 GHz exists, it is desired that magnitude LPF 113₁ the 1 μs pulse be detected. The detection is be verified by CPMU 117₁ and PDW resolver 123 outputs a PDW 125 describing the detected 1 μs pulse. The effective bandwidth of the pulse of interest (in this example 1 μs) may be determined according to Equation (1):

$$\text{Effective Bandwidth} = \sqrt{2(BW_{RF} \times BW_{video})}. \quad \text{Equation (1)}$$

where $BW_{video}$ may be estimated at $$\frac{1}{\text{pulse width}}.$$

Based on equation (1), it may be seen that from magnitude LPF 113₁ to magnitude LPF 113ₙ, the pulses get progressively wider. In the above example the pulse widths extend from 1 μs to 1 second. Accordingly, the video bandwidth gets narrower, as it is basically matched to the inverse of the pulse width. In this way, as much of the signal as possible is accommodated, without making the video bandwidth so narrow as to lose the signal. The tuned magnitude LPF 113 may then pass the tuned magnitudes to a logarithmic amplitude converter 115 which reduces the number of bits required to represent the output of magnitude LPF 113 by eliminating unnecessary amplitude precision. For example, if strong signals are received and processed in a device such as a field programmable gate array (FPGA), the FPGA has only a limited number of bits with which it can work. Given that the signal may be considered to be either strong or weak (i.e. not strong), the regular units may be converted to logarithmic units and represented by fewer bits. Thus, the FPGA may represent the signal for all downstream processing using a fewer number of bits.

The phase data 119 from delta phase converter 111 and the output from the magnitude LPF 113 or logarithmic amplitude converter 115 then is used as input to a CPMU 117. The CPMU 117 receives a difference in phase among a series of phase differences associated with the pulse width for magnitude LPF 113 connected to the CPMU 117. The CPMU 117 will process the phase differences and convert them to a frequency corresponding to the phase differences according to well known signal processing technologies. The phase differences received by CPMU 117 may be based on consecutive samples or intervals of samples (for example, every $5^{th}$ sample may be compared for phase differences). Additionally or alternatively, an average of the phases of every N samples may be taken and compared to another phase associated with another block of N samples (e.g. N=5). It should be understood that other intervals or methods for computing phase differences may be contemplated and would fall within the scope of the present invention.

In addition to phase differences, the CPMU 117 receives magnitude information from either the magnitude 113 or the logarithmic amplitude converter 115. Thus, the CPMU 117 receives both the phase and the magnitude information as a function of time. Based on the received magnitude information, the CPMU 117 determines whether the magnitude information exceeds a predetermined threshold for a given period of time and then falls back below the threshold. If so, a detection of a pulse is confirmed. The frequency for the detected pulse is determined by the CPMU 117. The function of the CPMU 117 may be compared to that of a constant false alarm rate (CFAR) application in a radar system as the CPMU verifies a detected signal in view of the background noise level.

In a radar system, measurements are taken from a number of buffer cells across range or Doppler and comparing measurements from those buffer cells with a cell under test. Similarly, the present invention may have buffers for which the magnitude data as a function of time is scrubbed. In contrast to a radar system, the pulse detector 100 of the present invention must detect pulses without knowing what was transmitted. The CPMU 117 maintains the flexibility necessary to process unknown signals by detecting and characterizing pulses, regardless of waveform modulation. Pulse detection is accomplished through configurable magnitude processing, rather than requiring radar detection processing via beforehand knowledge of a transmit signal replica. Pulse characterization leverages configurable phase processing which can look for phase patterns to determine an aggregate frequency, and even frequency modulation information.

The CPMU 117 may be configured to monitor received magnitude information and determine if a received magnitude exceeds a threshold for a certain time interval before dropping back below the threshold. If the magnitude exceeds the threshold for a requisite time interval and then drops below the threshold, a detection is made. If there is a detection, the CPMU 117 may be configured to process the phase difference information to determine a carrier frequency for the detected pulse. During a pulse detection, the CPMU 117 is configured to log the time sample at which it determined the magnitude rose above the threshold. The CPMU 117 may also log the time sample in which the magnitude drops back below the threshold. Pulse amplitude may also be logged by the CPMU 117. Thus, the parameters contained in a PDW, including amplitude, time up, time down and/or pulse width may be provided as part of the CPMU 117 output.

In some cases, due to strength and sensitivity, a pulse may have enough sufficient residual energy outside of its primary bandwidth defined by a parallel path 110, that it also creates a detection in a neighboring CPMU 117. For example, if a pulse was emitted that, due to its pulse width and energy level (magnitude) was detected clearly in path $110_2$ of FIG. 1, the residual energy of the pulse may cause a detection in one or more of neighboring CPMU $117_1$, CPMU $117_2$ and CPMU $117_3$. When that happens, the outputs of CPMU $117_1$, CPMU $117_2$ and CPMU $117_3$ each contain PDW information relating to the same pulse. From one perspective, it would appear that three pulses were detected in that, out of n processing paths 110, three of the paths detected pulses. Thus, because each path is tuned to a different pulse bandwidth, it appears three distinct pulses were detected.

On the other hand, consider a situation where three separate pulses have pulse widths of consecutive orders of magnitude as defined by processing paths 110. In this case, three pulse detections are logged in three different paths. However, based on the discussion above regarding energy of a single pulse bleeding into neighboring processing paths 110, it must be determined that the received detections do not relate to the same emitted pulse, but rather represent 3 distinct pulses. The practical consideration from an EW perspective of these two scenarios is that in the former, one target pulse is detected as many. For example, the detected pulse may be indicative of an incoming enemy missile. It is undesirable to detect three threats when in actuality there is only one. In the latter scenario, the cost of a wrong decision may be disastrous, in that three incoming threats may be misidentified as one, and leave open defenses against the remaining undetected threats.

The PDW information relating to detections in $CPMU_1$-$CPMU_n$ are therefore passed to the PDW resolver 123. The PDW resolver 123 makes decisions on potential detected pulses from the CPMUs 117 before finally outputting PDWs 125 associated with confirmed detections.

Figure 2:
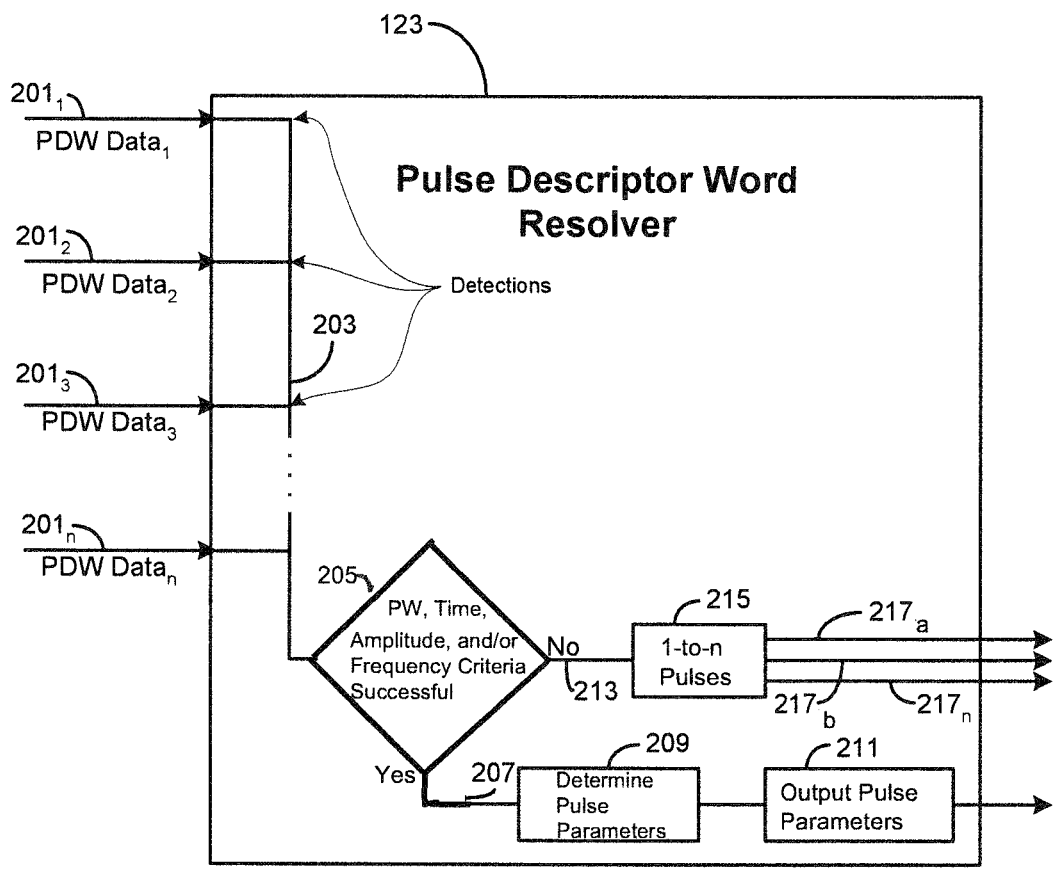
FIG. 2 is a block diagram of the operation of a pulse descriptor word resolver in accordance with an embodiment of the present invention.

Referring now to FIG. 2, a block diagram is shown which illustrates the operation of the PDW resolver 123 in more detail. PDW information $201_1$-$201_n$ is received by the PDW resolver 123 from the CPMUs 117. Referring to FIG. 2, assume PDW information $201_1$, $201_2$, and $201_3$ indicate a pulse detection 203 as described in the example above. Each CPMU provides information relating to a detected pulse which may include pulse width, or time up and time down, frequency and amplitude. The PDW information relating to the 3 detections 203 are compared as shown in decision logic module 205. The pulse width of one of the detections is compared to the pulse widths of the other detections. In addition, the pulse rise time is also compared to the detections to determine whether the pulses occurred simultaneously in time. Additional discrimination criteria include whether the pulse frequencies are within a certain tolerance, and whether the magnitudes are consistent in accordance with the video bandwidth and/or effective bandwidth in equation (1). For example, a threshold based on a percentage of the pulse width may be used to determine if the pulses are coincident. If the difference in pulse width and the time of incidence both fall within a threshold 207, then the PDW detector 123 may be configured to treat the pulses as coming from the same origin and only output 1 PDW relating to the detected pulse. To choose the output PDW, the three detections 203 may be combined to form a composite PDW in an embodiment of the present invention. Preferably, the longest pulse detection out of the three detections 203 is chosen via logic module 209 and the chosen longest pulse is output as a PDW 211.

In the case where more than one pulse is detected representing multiple threats and the emitted pulses are substantially coincident, the decision logic compares the PDW information 201 associated with each pulse detection as relating to pulse width and time of incidence. As discussed, because the emitted pulses are substantially coincident, the time of incidence will be determined to be below the threshold in this case.

By way of example, assume that the first detected pulse had a pulse width of 10 μs, while the second pulse detection had a pulse width of 1 ms. While the two pulses are coincident, the pulse widths are different by a factor of 100, thus indicating that the pulses represent two separate origins. In this case, the pulse width does not fall within the threshold boundary 207. The PDW resolver 123 generates PDWs for each separate pulse 215 and outputs a PDW for each pulse as illustrated by outputs $217_a$, $217_b$. In an embodiment of the present invention, the frequency information derived from the delta phase converters 111 (FIG. 1) may be used to further validate the carrier frequency of a detected pulse to reinforce the decision that the detected pulses were detected on the same or different carrier frequencies. In an alternate embodiment there is provided a configuration option for choosing the highest magnitude pulse to output. In another alternate embodiment there is provided a configuration option to combine pulse data in proportion to pulse magnitudes.

Figure 3:
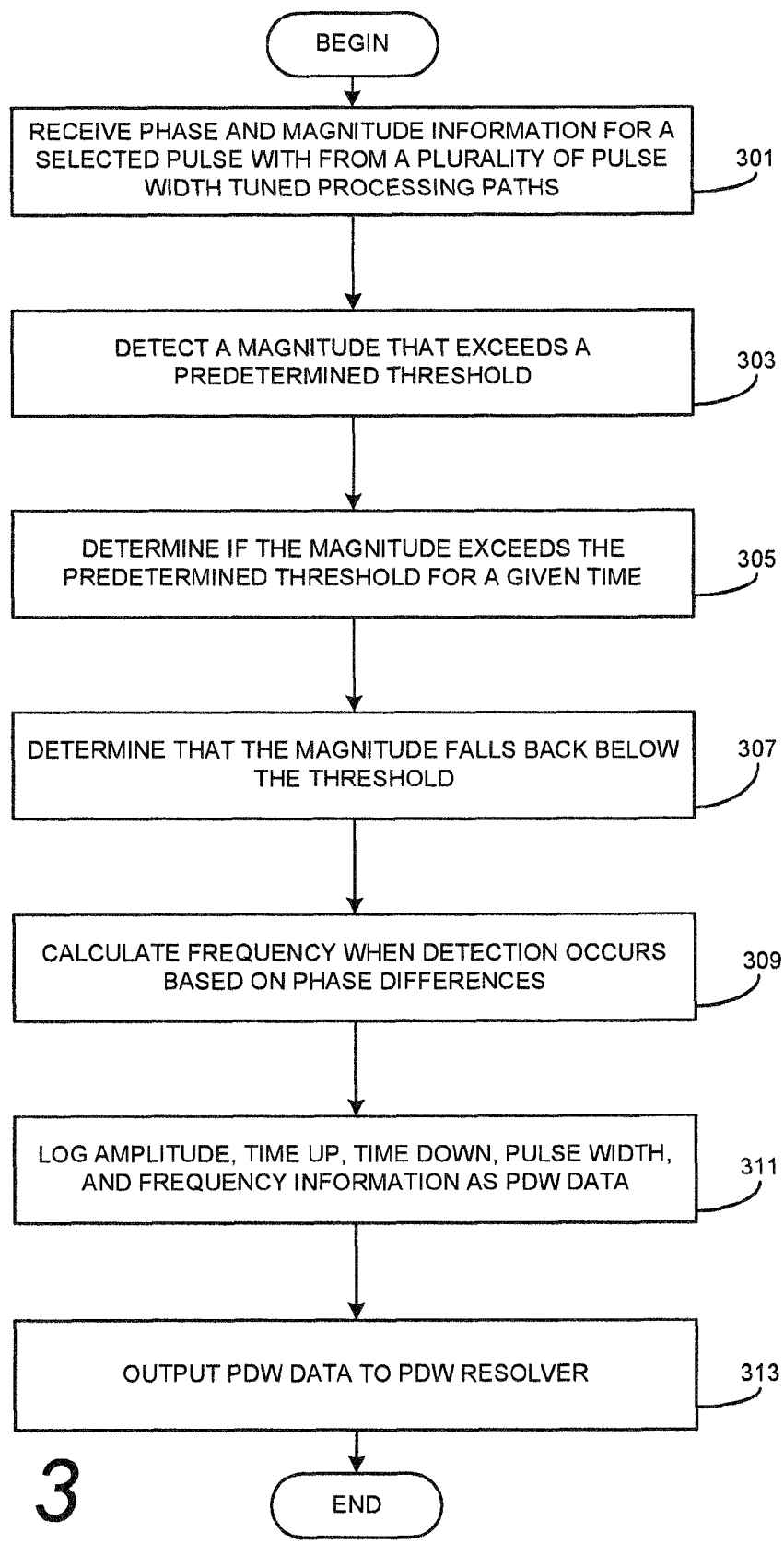
FIG. 3 is a flow diagram depicting a method of detecting multiple pulses in an RF signal in accordance with an embodiment of the present invention.

FIG. 3 is a flow diagram of a method of detecting pulses in a complex parameter measurement unit according to an embodiment of the present invention. In block 301, phase and magnitude information for a selected pulse width is received from a plurality of pulse width tuned processing paths. At block 303, a determination is made whether a received magnitude exceeds a predetermined threshold. Upon detection of a received magnitude that exceeds the predetermined threshold, the system determines if the magnitude exceeds the threshold for a requisite time interval as shown in block 305. It is then determined if the magnitude again drops below the threshold after exceeding the threshold for the given time period (block 307). If the received magnitude exceeds the predetermined threshold for the prescribed period of time and then drops back below the threshold, a pulse associated with the received magnitude is considered to be detected. When a detection occurs, the carrier frequency is calculated based on the phase information received 309. The CPMU then logs the PDW information including, amplitude, time up, time down, pulse width and frequency 311 and outputs the PDW information 313 to the PDW resolver 123.

Figure 4:
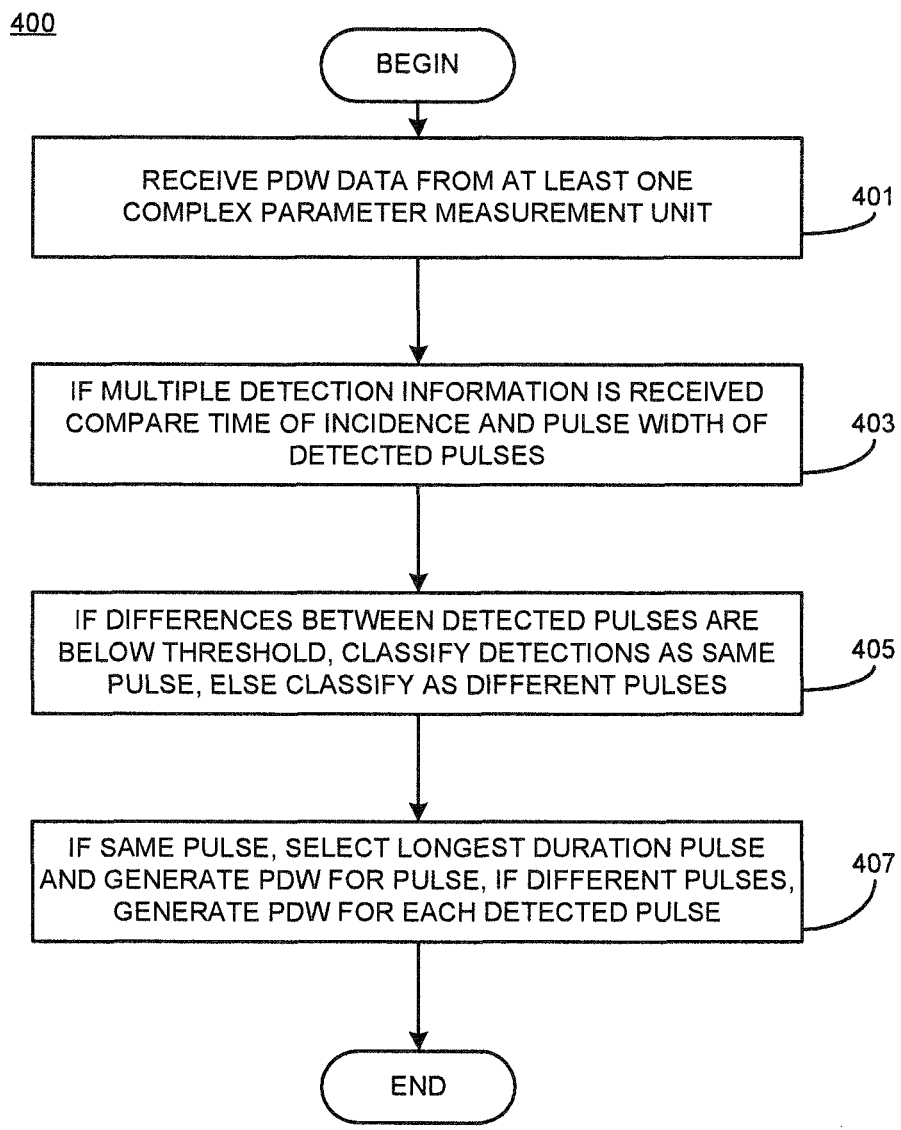
FIG. 4 is a flow diagram depicting a method of resolving pulse descriptor words from multiple detected pulses in accordance with an embodiment of the present invention.

Referring now to FIG. 4, there is shown a flow diagram for verifying multiple pulses 400 in a PDW resolver 123. PDW data is received from at least one CPMU 117 (block 401). The information coming from the CPMUs may include frequency information as well as magnitude, pulse width and up time and down time for a pulse detected at the CPMU 117. If more than one of the CPMUs 117 sends information indicating a pulse was detected, the multiple detected pulses are compared with respect to pulse width and time of incidence (block 403). If the differences in both pulse width and time of incidence fall within a predetermined threshold, the multiple detected pulses from different CPMUs 117 are classified as a single pulse coming from the same source (block 405). If either the pulse width or the time of incidence falls outside of the predetermined threshold level, the pulses are classified as originating from different sources (block 405). In the case where multiple detected pulses are classified as the same pulse, the detected pulse associated with the longest detected pulse width is selected and a PDW is generated for the selected longest pulse. If the detected pulses are classified as unique pulses originating from different sources, a PDW for each unique pulse is generated and output (block 407).

Figure 5:
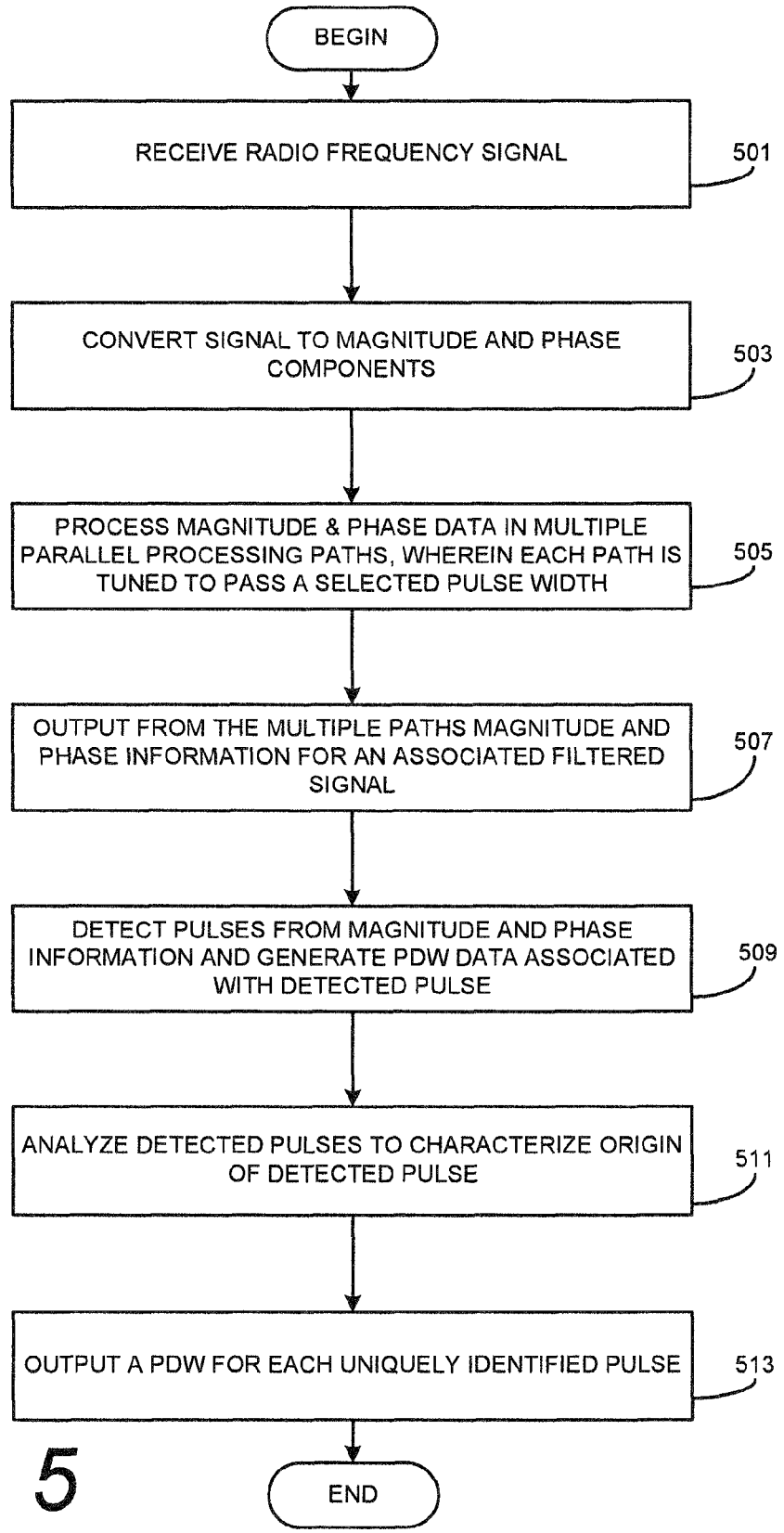
FIG. 5 is a flow diagram depicting a method of detecting multiple pulses in an RF environment according to an embodiment of the present invention.

FIG. 5 is a flow diagram depicting a method of detecting multiple pulses 500 in a received RF signal according to an embodiment of the present invention. In block 501, an RF signal is received. The RF signal is representative of the RF environment in which the pulse detection apparatus is operating. The RF signal is converted to I/O data (e.g. polar form) as shown in block 503. The magnitude and phase information is processed in a plurality of parallel processing paths, wherein each processing path is tuned to pass a selected video bandwidth (block 505). The processing paths may be implemented such that each successive parallel processing path is tuned to pass a wider pulse width in a narrower effective bandwidth. Each parallel processing path comprises two parallel paths, wherein one of the two parallel paths comprises a delta phase converter for processing the phase information to derive information about the carrier frequency for pulses of the tuned pulse width. The second parallel path comprises a magnitude low pass filter and optionally a logarithmic amplitude converter. The magnitude LPF is tuned to pass the magnitude information for signals matching a video bandwidth of interest for that parallel processing path. In this way, the video bandwidth is sufficient to capture pulses of the desired pulse width while lowering the effective noise bandwidth. The multiple parallel processing paths then output magnitude and phase information for a filtered signal associated with the tuned pulse width or video bandwidth (block 507). Based on the magnitude and phase information, pulses are detected and PDW information relating to detected pulses (block 509). A pulse may be detected as a result of an observed magnitude rising above a predetermined threshold, remaining above the threshold for a given period of time and then falling below the threshold. When a pulse is detected, the frequency information relating to the carrier frequency of the detected pulse may be derived from the phase difference data. Detected pulses are then analyzed to characterize the source of the detected pulse (block 511). Detected pulses may result from adjacent processing paths and may be characterized as a single pulse source in which the pulse energy is sufficient to trigger a pulse detection in the parallel processing path tuned to pulse width, and in which the signal strength was sufficient to trigger a magnitude measurement that exceeds the threshold in one or more neighboring parallel processing paths. Multiple pulse detections may be analyzed with respect to pulse width and time of incidence to make a determination if multiple pulse detections are indicative of a single pulse detected in multiple processing paths, or whether they represent unique and separate pulses that may have been emitted simultaneously. If both pulse width and time of incidence fall within a given threshold (which may be expressed as a percentage) then the detected pulses are considered to be from the same source (and thus the same pulse). Otherwise, the detected pulses are considered to be from separate sources and distinct pulses. A PDW is generated and output for each uniquely identified pulse (block 513).

The exemplary embodiments described herein are provided by way of non-limiting example only. They are intended to provides a better understanding of the present invention and to describe what the inventors consider the best mode for carrying out the invention. Other configurations, as well as additions or substitutions may be conceived by one skilled in the art which would fall within the intended scope of this description. The true scope of the present invention is limited only to the accompanying set of claims.

What is claimed is:

1. An apparatus for detecting multiple pulse widths in a received radio frequency spectrum comprising:
    a coordinate translator, for converting in-phase and quadrature components of a received RF signal into magnitude and phase components;
    a plurality of magnitude low pass filters (LPFs) coupled to said coordinate translator, wherein each of said magnitude LPF is tuned to pass pulses of a selected pulse width;
    a plurality of complex parameter measurement units (CPMUs), each CPMU coupled to one of said magnitude LPFs;
    a pulse descriptor word (PDW) resolver coupled to said plurality of CPMUs configured to detect pulses passed by at least one of said magnitude LPFs and pass at least one PDW based on said detected pulses.

2. The apparatus of claim 1, further comprising a plurality of delta phase converters coupled to said coordinate translator and each of said CPMUs in parallel with said magnitude LPFs.

3. The apparatus of claim 1, further comprising a plurality of log amplitude converters coupled between each said magnitude LPF and each CPMU.

4. The apparatus of claim 1, wherein each magnitude LPF is tuned to pass an effective bandwidth according to $$\sqrt{2 \times BW_{RF} \times BW_{video}}.$$

5. The apparatus of claim 1, wherein each of said magnitude LPFs is tuned to a wider pulse width than a preceding magnitude LPF.

6. The apparatus of claim 1, wherein the PDW resolver is configured to receive a plurality of pulse detections from said CPMUs and identify a target source associated with each pulse detection.

7. The apparatus of claim 6, wherein the PDW resolver is further configured to receive a plurality of pulse detections and identify said plurality of pulse detections as originating from a common source.

8. The apparatus of claim 7, wherein the PDW resolver is further configured to output a PDW associated with a longest pulse detection of said plurality of pulse detections.

9. An method of detecting multiple pulse widths in a received radio frequency spectrum comprising:
    converting in-phase and quadrature components of a received RF signal into magnitude and phase components;
    filtering a plurality of selected pulse widths based on said magnitude;
    measuring the parameters of said filtered pulse widths and determining if a pulse is detected;
    generating at least one pulse descriptor word (PDW) based on at least one detected pulse.

10. The method of claim 9, further comprising determining a phase difference for a pulse of a selected pulse width.

11. The method of claim 9, further comprising reducing the precision of a filtered magnitude before measuring the parameters of said filtered pulse widths.

12. The method of claim 9, wherein said filtering is tuned to an effective bandwidth according to $$\sqrt{2 \times BW_{RF} \times BW_{video}}.$$

13. The method of claim 9, wherein each filtered pulse width is tuned to a wider pulse width than a preceding filtered pulse width.

14. The method of claim 9, further comprising receiving a plurality of pulse detections; and
    identifying a target source associated with each pulse detection.

15. The method of claim 14, further comprising receiving a plurality of pulse detections; and
    identifying said plurality of pulse detections as originating from a common source.

16. The method of claim 15, further comprising outputting a PDW associated with a longest pulse detection of said plurality of pulse detections.

17. A method of generating pulse descriptor words (PDWs), the method comprising:
    receiving at least one pulse detection and generating at least one PDW based on the length of the at least one pulse detection.

18. The method of claim 17, further comprising receiving a plurality of pulse detections from a plurality of filtered channels.

19. The method of claim 18, further comprising identifying that the plurality of pulse detections originate from a common source.

20. The method of claim 19, further comprising identifying an originating source for each of the plurality of pulse detections.

* * * * *